(12) United States Patent
Srinivasa et al.

(10) Patent No.: US 10,483,993 B1
(45) Date of Patent: Nov. 19, 2019

(54) RESIDUE AMPLIFIER

(71) Applicant: TEXAS INSTRUMENTS INCORPORATED, Dallas, TX (US)

(72) Inventors: Raghu Nandan Srinivasa, Bengaluru (IN); Srinivas Bangalore Seshadri, Bengaluru (IN); Sabu Paul, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/234,648

(22) Filed: Dec. 28, 2018

(51) Int. Cl.
  *H03M 1/22* (2006.01)
  *H03M 1/06* (2006.01)
  *H03F 1/26* (2006.01)
  *H03F 3/45* (2006.01)

(52) U.S. Cl.
  CPC ........... *H03M 1/0604* (2013.01); *H03F 1/26* (2013.01); *H03F 3/45269* (2013.01); *H03F 3/45273* (2013.01); *H03F 2203/45461* (2013.01)

(58) Field of Classification Search
  CPC .......... H03M 1/0604; H03M 1/403; H03F 2203/45461; H03F 1/26; H03F 1/30
  USPC ................... 341/122, 144, 155, 150
  See application file for complete search history.

(56) References Cited

U.S. PATENT DOCUMENTS

| | | | |
|---|---|---|---|
| 8,686,888 B2* | 4/2014 | Chou ............... | H03F 3/005 341/155 |
| 2010/0019946 A1* | 1/2010 | Ali ............... | H03F 3/45286 341/161 |
| 2015/0207405 A1* | 7/2015 | Agarwal ............ | H03M 1/70 341/144 |

* cited by examiner

*Primary Examiner* — Peguy Jean Pierre
(74) *Attorney, Agent, or Firm* — John R. Pessetto; Charles A. Brill; Frank D. Cimino

(57) ABSTRACT

A pipelined analog-to-digital converter (ADC) and a residue amplifier used in the ADC. An ADC includes a capacitive digital-to-analog converter (CDAC), a residue amplifier, and a switched capacitor circuit. The residue amplifier is coupled to the CDAC. The residue amplifier includes a first complementary transistor pair and a first tail current circuit. The first complementary transistor pair is coupled to a first output of the CDAC, and includes a high-side transistor and a low-side transistor. The first tail current circuit is coupled to the high side transistor. The switched capacitor circuit is coupled to inputs of the CDAC and to the first tail current circuit. The switched capacitor circuit is configured to generate a voltage to bias the first tail current circuit with compensation for common mode voltage at the inputs of the CDAC.

20 Claims, 9 Drawing Sheets

RESIDUE AMPLIFIER

BACKGROUND

An analog-to-digital converter is a circuit that generates a digital value representative of a sample of an analog signal. Various analog-to-digital data converters and conversion techniques are available for converting samples of an analog electrical signal to digital values. In general, the process of analog-to-digital conversion includes sampling an analog signal and comparing the sampled analog signal to a threshold value. A binary result is recorded depending upon the result of the comparison. The process of comparing the sample to a threshold may be repeated a number of times with each successive comparison using a different threshold and residue of the sample.

A pipelined ADC includes multiple ADC stages. Each of the ADC stages generates a digital sub-code corresponding to a voltage level of an analog signal received as an input, and generates a residue signal for processing and digitization by a downstream ADC stage.

SUMMARY

A residue amplifier for use in a pipelined analog-to-digital converter (ADC) is disclosed herein. The residue amplifier uses a switched capacitor circuit to generate a bias voltage that compensates for input signal common mode voltage, which in-turn improves the gain accuracy and signal-to-noise ratio of the residue amplifier, and improves the overall accuracy of the ADC. In one example, an ADC includes a capacitive digital-to-analog converter (CDAC), a residue amplifier, and a switched capacitor circuit. The residue amplifier is coupled to the CDAC. The residue amplifier includes a first complementary transistor pair and a first tail current circuit. The first complementary transistor pair is coupled to a first output of the CDAC, and includes a high-side transistor and a low-side transistor. The first tail current circuit is coupled to the high side transistor. The switched capacitor circuit is coupled to inputs of the CDAC and to the first tail current circuit. The switched capacitor circuit is configured to generate a voltage to bias the first tail current circuit with compensation for common mode voltage at the inputs of the CDAC.

In another example, a residue amplifier includes a preamplifier and a switched capacitor circuit. The preamplifier includes a first transistor, a second transistor, a third transistor, a fourth transistor, and a first tail current circuit. The second transistor includes a first terminal that is coupled to a first terminal of the first transistor, and a second terminal that is coupled to a second terminal of the first transistor. The third transistor includes a first terminal that is coupled to a third terminal of the first transistor. The fourth transistor includes a first terminal that is coupled to a second terminal of the third transistor, a second terminal that is coupled to a third terminal of the third transistor, and a third terminal coupled to a third terminal of the second transistor. The first tail current circuit is coupled to the first terminal of the third transistor and the third terminal of the first transistor. The switched capacitor circuit includes a hold capacitor. A top plate of the hold capacitor is coupled to a terminal of the first tail current circuit.

In a further example, a residue amplifier includes a preamplifier and a switched capacitor circuit. The preamplifier includes a first input terminal, a second input terminal, a first complementary transistor pair, a second complementary transistor pair, a first tail current circuit, and a second tail current circuit. The first input terminal is for connection to a first output of a CDAC. The second input terminal is for connection to a second output of the CDAC. The first complementary transistor pair is coupled to the first input terminal. The second complementary transistor pair is coupled to the second input terminal. The first tail current circuit is coupled to, and configured to provide a first bias current to, the first complementary transistor pair and the second complementary transistor pair. The second tail current circuit is coupled to, and configured to provide a second bias current to, the first complementary transistor pair and the second complementary transistor pair. The switched capacitor circuit is coupled to the first tail current circuit and the second tail current circuit, and configured to provide to the first tail current circuit and the second tail current circuit a bias voltage that is a function of top plate common mode voltage provided to the CDAC and common mode voltage of input signal provided to the CDAC for digitization.

BRIEF DESCRIPTION OF THE DRAWINGS

For a detailed description of various examples, reference will now be made to the accompanying drawings in which.

DETAILED DESCRIPTION

Figure 1:
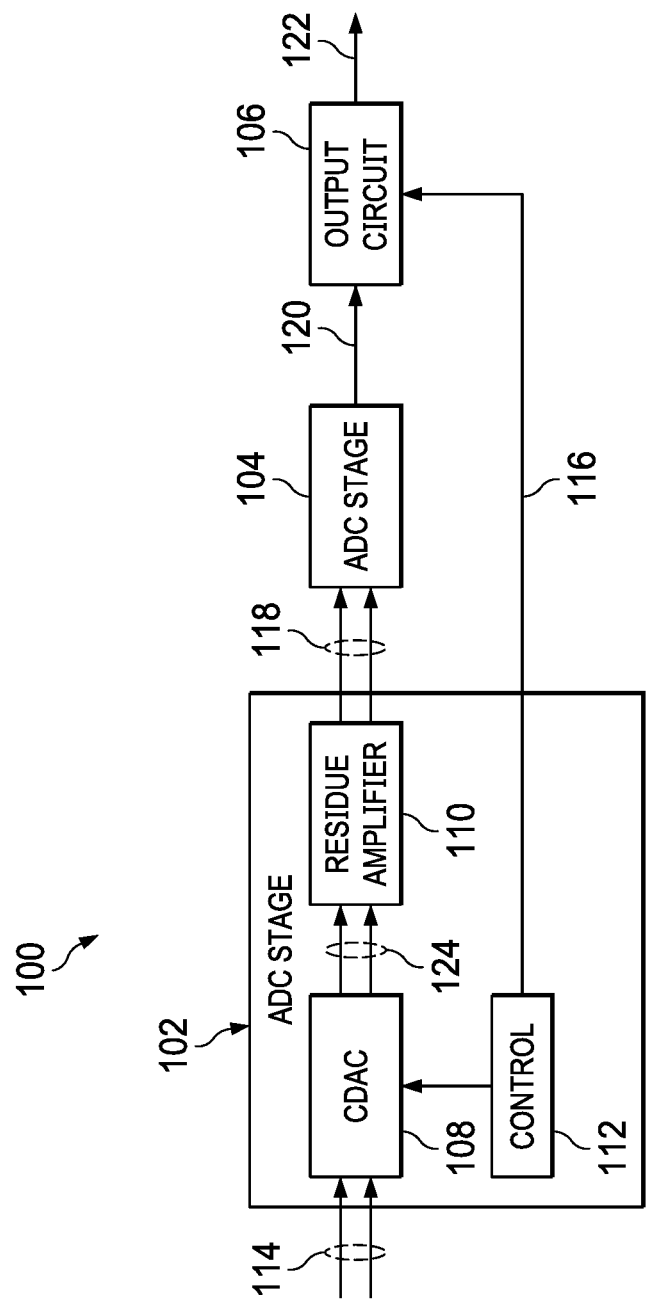
FIG. 1 shows a block diagram for a pipelined analog-to-digital converter (ADC) in accordance with the present disclosure.

Certain terms have been used throughout this description and claims to refer to particular system components. As one skilled in the art will appreciate, different parties may refer to a component by different names. This document does not intend to distinguish between components that differ in name but not function. In this disclosure and claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections. The recitation "based on" is intended to mean "based at least in part on." Therefore, if X is based on Y, X may be a function of Y and any number of other factors.

In a pipelined analog-to-digital converter (ADC), each stage of the ADC that produces a residue signal includes a residue amplifier that drives the residue signal to a successive ADC stage. One low-power, low-noise residue amplifier topology includes a preamplifier with gain in the range of 5×-15× followed by a high gain amplifier. Input signal is provided to a complementary pair of negative (N) metal oxide semiconductor (MOS) and positive (P) MOS transistors to reduce power for an associated noise specification. The amplifier input common mode (average voltage at complementary outputs of a capacitive digital-to-analog converter (CDAC) is a function of the input common mode voltage at the signal inputs of the CDAC. The amplifier bias currents, are sensitive to variations in the amplifier input common mode voltage and hence are sensitive to the common mode voltage at the signal inputs of the CDAC. To achieve accurate preamplifier gain and robust ADC performance, the bias currents generated in the preamplifier should be accurate.

In an attempt to properly control residue preamplifier bias currents, some residue amplifiers include cascode transistors in the bias current circuitry that are scaled replicas of the amplifier input transistors. For this technique to be effective, the gate voltage of the scaled replica transistors must be the same as the gate voltage at the preamplifier input transistors. One approach to setting the gate voltage of the replica transistors uses the common mode voltage driven onto the top plates of the CDAC sampling capacitors to bias the gates of the replica transistors. For this biasing scheme to work, the hold phase common mode should be the same as the sampling phase common mode, which in turn requires the signal input common mode voltage to be equal to the reference common mode driven onto the bottom plates of the CDAC sampling capacitors in hold mode. Because amplifier biasing is sensitive to the input signal common mode voltage, the residue amplifier gain and stability is also sensitive to the input signal common mode voltage. As a result, ADC signal-to-noise ratio performance may be significantly degraded beyond a narrow range of permitted input signal common mode voltage. Such residue amplifier implementations may also have related sensitivities to temperature and supply voltage.

Implementations of the residue amplifier disclosed herein include a switched capacitor circuit that generates a voltage that is equal to the hold phase common mode voltage of the CDAC driving the residue amplifier. The capacitors of the switched capacitor circuit match the capacitors of the CDAC to account for variations in the scaling factor K. The hold phase common mode voltage is:

$$\frac{VTTP + VTPM}{2} = TPCM + K(REFCM - INCM)$$

where:
VTTP is positive side differential input to the residue amplifier provided by the CDAC;
VTPM is negative side differential input to the residue amplifier provided by the CDAC;
TPCM is common mode voltage driven on the top plates of the CDAC sampling capacitors during the sampling phase;
REFCM is the common mode voltage driven onto the bottom plates of the CDAC sampling capacitors during the hold phase;
K is a ratio of sampling capacitance to a sum of sampling capacitance and parasitic capacitance $$\left(\frac{C_S}{C_S + C_P}\right);$$

and
INCM is the input signal common mode voltage.

Using the hold phase common mode voltage generated by the switched capacitor circuit, the residue amplifiers of the present disclosure ensure that the bias currents generated in the residue amplifier are accurate and insensitive to variation in input signal common mode voltage. In turn, the preamplifier gain and ADC performance are insensitive to input common mode voltage.

FIG. 1 shows a block diagram for a pipelined ADC 100 in accordance with the present disclosure. The pipelined ADC 100 includes an ADC stage 102, an ADC stage 104, and output circuitry 106. The ADC stage 102 receives an analog input signal 114 and produces a digital value 116 representative of the analog input signal 114. The digital value 116 includes a predetermined number of bits. The ADC stage 102 also produces a residue signal 118 that is representative of a portion of the analog input signal 114 not digitized by the ADC stage 102. The ADC stage 104 receives the residue signal 118 and produces a digital value 120 that is representative of the residue signal 118. The output circuitry 106 combines the digital value 116 and the digital value 120 to produce a digital value 122 that is representative of the analog input signal 114.

The ADC stage 102 includes a CDAC 108, a residue amplifier 110, and control circuitry 112. The control circuitry 112 controls switches of the CDAC 108 to compare the analog input signal 114 to a plurality of reference values. The signal 124 output by the CDAC 108 is the difference of the analog input signal 114 and the analog signal represented by the digital value 116. The residue amplifier 110 is coupled to the CDAC 108 and includes circuitry to amplify the signal 124 for digitization by the ADC stage 104. Implementations of the residue amplifier 110 include a switched capacitor circuit that generates bias voltage for the residue amplifier 110 with compensation for common mode voltage of the analog input signal 114. By compensating for common mode voltage of the analog input signal 114, the residue amplifier 110 reduces variation in the gain of the residue amplifier 110, and in turn improves the accuracy of the pipelined ADC 100.

Figure 2:
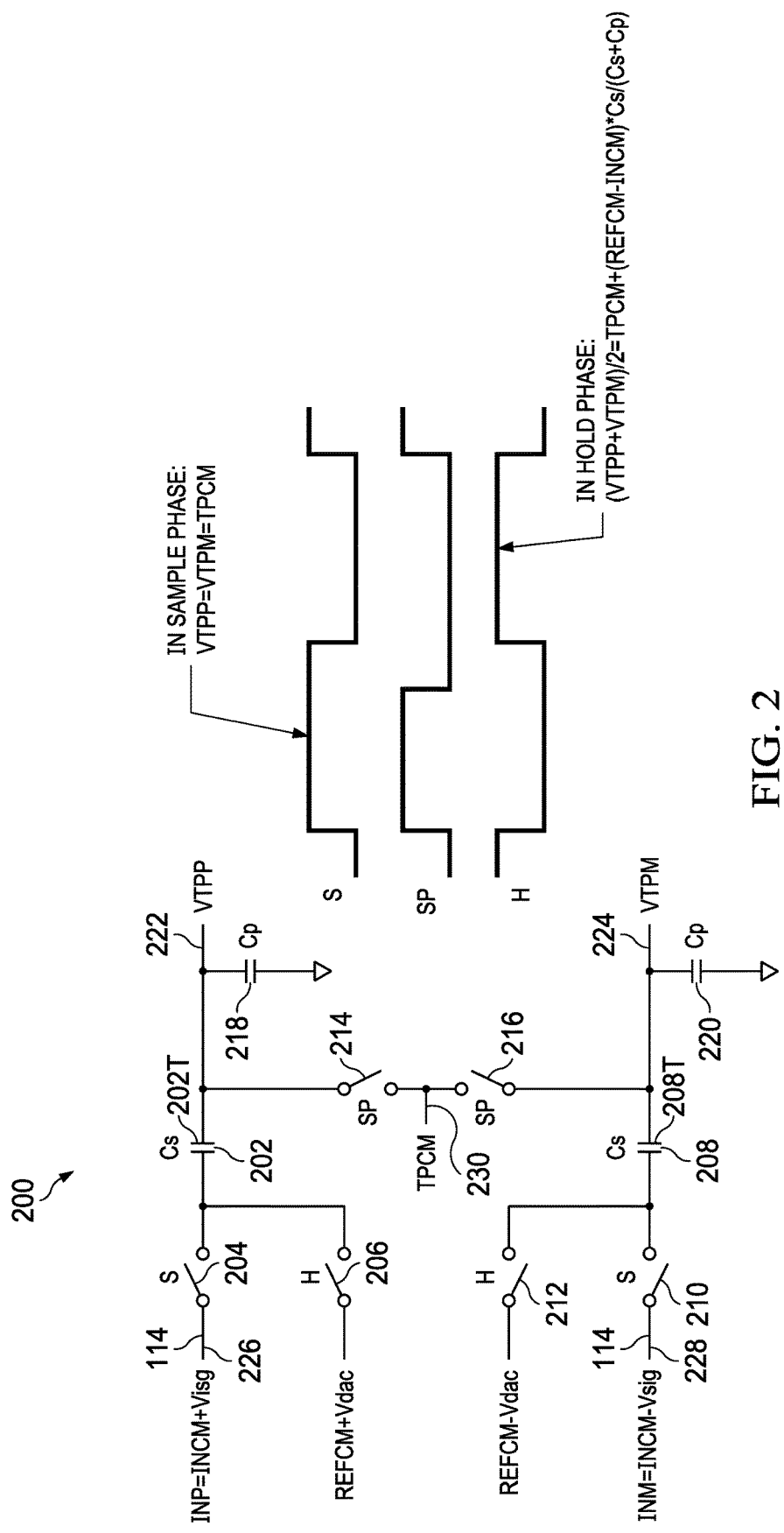
FIG. 2 shows schematic diagram for a capacitive digital-to-analog converter suitable for use in a pipelined ADC in accordance with the present disclosure.

FIG. 2 shows schematic diagram for an example CDAC 200 suitable for use in the pipelined ADC 100. The CDAC 200 is an implementation of the CDAC 108. The CDAC 200 includes sampling capacitors 202, sampling switches 204, and reference switches 206. While the sampling capacitors 202 are represented in FIG. 2 as a single capacitor, in practice, the sampling capacitors 202 includes a plurality of binary weighted or equally weighted capacitors. Similarly, the sampling switches 204 and the reference switches 206 represent a plurality of switches. Each of the sampling capacitors 202 is coupled to one of the plurality of the sampling switches 204 and one of the plurality of the reference switches 206. The control circuitry 112 controls the operation of the sampling switches 204 and the reference switches 206 to connect the sampling capacitors 202 to the analog input signal 114 or to a reference voltage source. For example, for a given one of the sampling capacitors 202, the control circuitry 112 closes the sampling switches 204 (and open the reference switches 206) to connect the sampling capacitors 202 to the analog input signal 114 during a sampling interval, and close the reference switches 206 (and open the sampling switches 204) to connect the sampling capacitors 202 to a reference voltage during a hold interval. The analog input signal 114 is a differential signal, and the positive side of the analog input signal 114 is provided to the sampling switches 204.

The CDAC 200 also includes sampling capacitors 208, sampling switches 210, and reference switches 212 that are respectively similar to the sampling capacitors 202, the sampling switches 204, and the reference switches 206. The negative side of the analog input signal 114 is provided to the sampling switches 210.

The CDAC 200 also includes a top plate common mode switch 214 and a top plate common mode switch 216. The top plate common mode switch 214 and the top plate common mode switch 216 respectively switchably connect the top plate of the sampling capacitors 202 and the top plate of the sampling capacitors 208 to a reference voltage TPCM. In some implementations, TPCM is one-half of the voltage powering the residue amplifier 110. The control circuitry 112 closes the top plate common mode switch 214 and the top plate common mode switch 216 while the sampling capacitors 202 and the sampling capacitors 208 are sampling the analog input signal 114. The CDAC 200 also includes parasitic capacitance 218 and parasitic capacitance 220.

Figure 3:
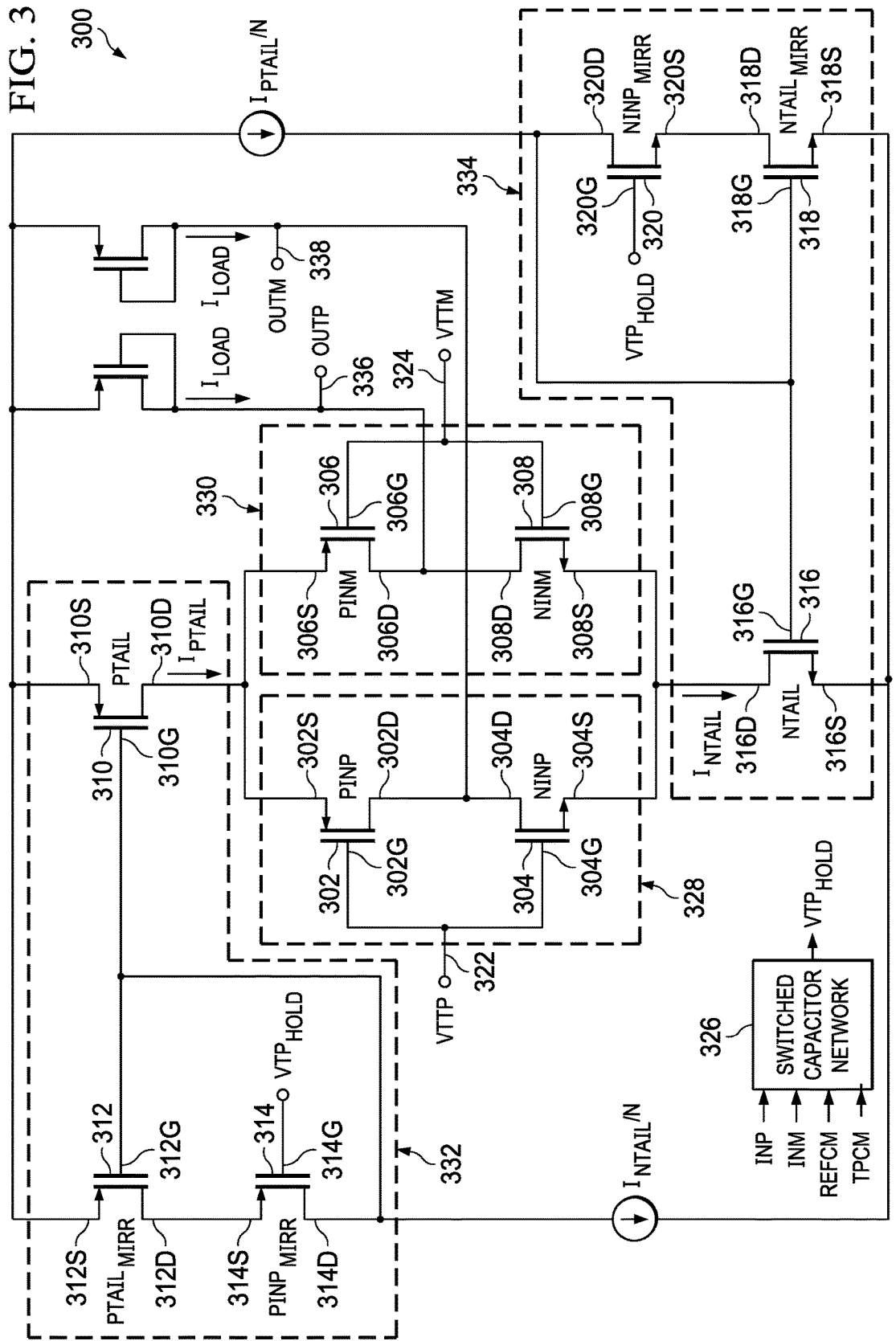
FIG. 3 shows a schematic diagram for a preamplifier stage of a residue amplifier suitable for use in a pipelined ADC in accordance with the present disclosure.

FIG. 3 shows a schematic diagram for a preamplifier stage 300 of a residue amplifier suitable for use in a pipelined ADC in accordance with the present disclosure. The preamplifier stage 300 is included in an implementation of the residue amplifier 110. The preamplifier stage 300 includes switched capacitor circuit 326, a complementary transistor pair 328, a complementary transistor pair 330, a tail current circuit 332, and a tail current circuit 334. In some implementations, the switched capacitor circuit 326 is separate from the preamplifier stage 300. The complementary transistor pair 328 is coupled to output 222 of the CDAC 200 and includes a high-side transistor 302 and a low-side transistor 304. In some implementations, the high-side transistor 302 is a p-channel MOSFET and the low-side transistor 304 is an n-channel MOSFET. A gate terminal 302G of the high-side transistor 302 is connected to a gate terminal 304G of the low-side transistor 304 and to an input terminal 322. The input terminal 322 is connected to the output 222 of the CDAC 200 to receive the signal 124. The drain terminal 302D of the high-side transistor 302 is connected to the drain terminal 304D of the low-side transistor 304.

Similarly, the complementary transistor pair 330 is coupled to output 224 of the CDAC 200 and includes a high-side transistor 306 and a low-side transistor 308. In some implementations, the high-side transistor 306 is a p-channel MOSFET and the low-side transistor 308 is an n-channel MOSFET. A gate terminal 306G of the high-side transistor 306 is connected to a gate terminal 308G of the low-side transistor 308 and to an input terminal 324. The input terminal 324 is connected to output 224 of the CDAC 200 to receive the signal 124. The drain terminal 306D of the high-side transistor 306 is connected to the drain terminal 308D of the low-side transistor 308. Output of the preamplifier stage 300 is provided at the terminal 336 and the terminal 338 for amplification by additional stages of the residue amplifier 110.

The source terminal 302S of the high-side transistor 302 is connected to the source terminal 306S of the high-side transistor 306 and to the tail current circuit 332. The tail current circuit 332 sources bias current to drive the complementary transistor pair 328 and the complementary transistor pair 330. The tail current circuit 332 includes a transistor 310, a transistor 312, and a transistor 314. The drain terminal 310D of the transistor 310 is connected to the source terminal 302S of the high-side transistor 302 and the source terminal 306S of the high-side transistor 306. The gate terminal 310G of the transistor 310 is connected to the gate terminal 312G of the transistor 312 and to the drain terminal 314D of the transistor 314. The source terminal 310S of the transistor 310 is connected to the source terminal 312S of the transistor 312 (e.g., connected to a power rail).

The drain terminal 312D of the transistor 312 is connected to the source terminal 314S of the transistor 314. The gate terminal 314G of the transistor 314 is connected to the switched capacitor circuit 326. The switched capacitor circuit 326 is coupled to and generates the voltage that biases the tail current circuit 332. The switched capacitor circuit 326 compensates for common mode voltage at the inputs of the CDAC 200 to improve the accuracy of the bias current generated by the tail current circuit 332.

The source terminal 304S of the low-side transistor 304 is connected to the source terminal 308S of the low-side transistor 308 and to the tail current circuit 334. The tail current circuit 334 sinks bias current to drive the complementary transistor pair 328 and the complementary transistor pair 330. The tail current circuit 334 includes a transistor 316, a transistor 318, and a transistor 320. The drain terminal 316D of the transistor 316 is connected to the source terminal 304S of the low-side transistor 304 and the source terminal 308S of the low-side transistor 308. The gate terminal 316G of the transistor 316 is connected to the gate terminal 318G of the transistor 318 and to the drain terminal 320D of the transistor 320. The source terminal 316S of the transistor 316 is connected to the source terminal 318S of the transistor 318 (e.g., connected to a power rail).

The drain terminal 318D of the transistor 318 is connected to the source terminal 320S of the transistor 320. The gate terminal 320G of the transistor 320 is connected to the switched capacitor circuit 326. The switched capacitor circuit 326 is coupled to and generates the voltage that biases the tail current circuit 334.

Figure 4:
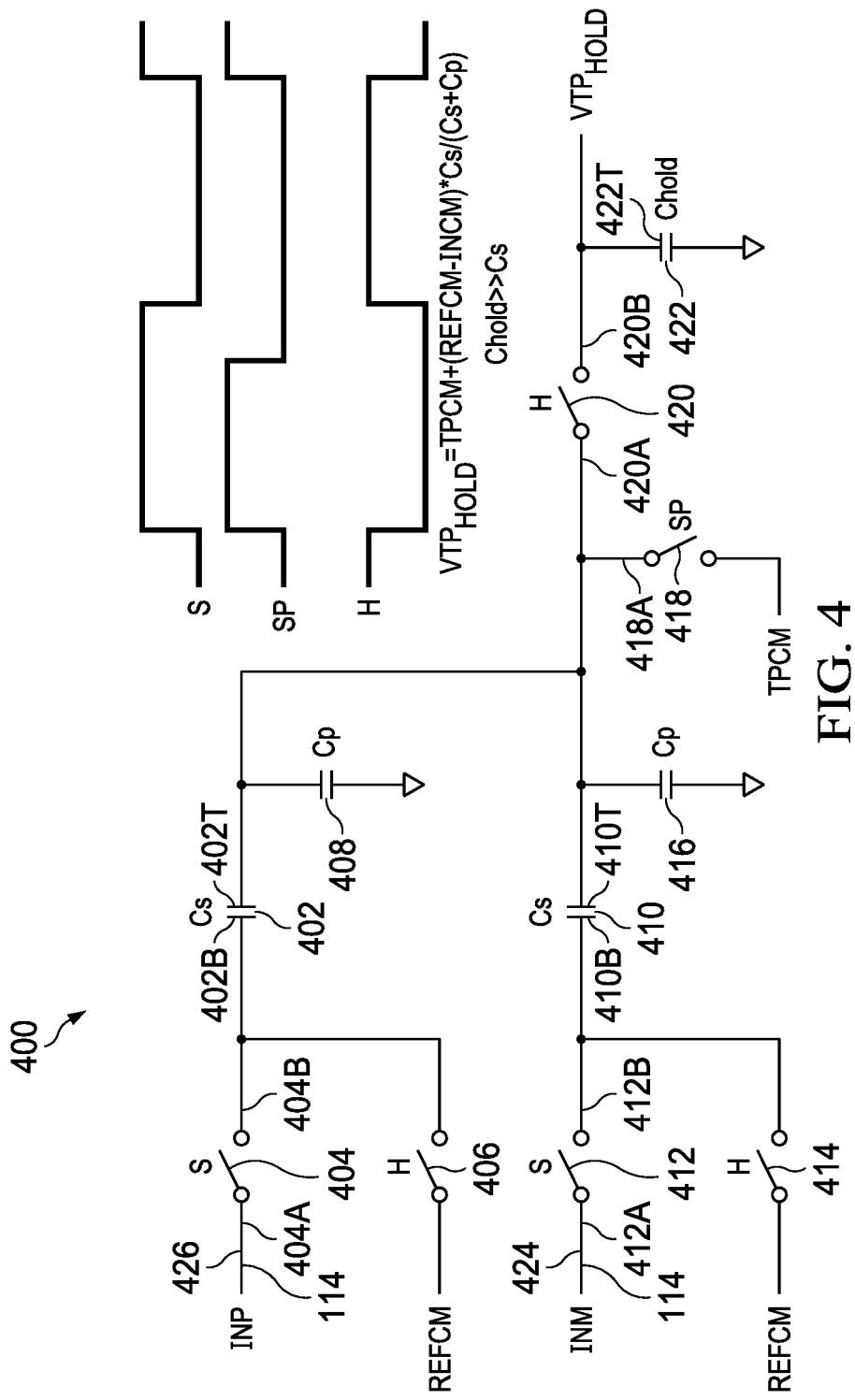
FIG. 4 shows a switched capacitor circuit for generating a bias voltage for tail current circuits of a residue amplifier in accordance with the present disclosure.

FIG. 4 shows a switched capacitor circuit 400 for generating a bias voltage for tail current circuits of a residue amplifier in accordance with the present disclosure. The switched capacitor circuit 400 is an implementation of the switched capacitor circuit 326. The signal inputs 426 and 424 of the switched capacitor circuit 400 are respectively coupled to the input 226 and input 228 of the CDAC 200. The switched capacitor circuit 400 includes sampling capacitors 402, sampling switches 404, reference switches 406, sampling capacitors 410, sampling switches 412, reference switches 414, top plate common mode switch 418, hold switch 420, and hold capacitor 422. While the sampling capacitors 402 are represented in FIG. 4 as a single capacitor, in practice, the sampling capacitors 402 includes a plurality of binary weighted capacitors. Similarly, the sampling switches 404 and the reference switches 406 represent a plurality of switches.

Each of the sampling capacitors 402 includes bottom plate 402B and a top plate 402T. The bottom plate 402B of each sampling capacitor 402 is coupled to one of the sampling switches 404 and one of the reference switches 406. Each of the sampling switches 404 includes a terminal 404B that is coupled to the bottom plate 402B of one of the sampling capacitors 402, and a terminal 404A that is coupled to an input terminal 426 (and the input 226 of the CDAC 200) for receiving the analog input signal 114. The control circuitry 112 controls the operation of the sampling switches 404 and the reference switches 406 to connect the sampling capacitors 402 to the analog input signal 114 or to a reference voltage source. For example, for a given one of the sampling capacitors 402, the control circuitry 112 closes the sampling switch 404 (and open the reference switch 406) to connect the sampling capacitor 402 to the analog input signal 114 during a sampling interval, and close the reference switch 406 (and open the sampling switch 404) to connect the sampling capacitor 402 to a reference voltage during a hold interval. The analog input signal 114 is a differential signal, and the positive side of the analog input signal 114 is provided to the input terminal 426.

The sampling capacitors 410, sampling switches 412, and reference switches 414 are similar to the sampling capacitors 402, the sampling switches 404, and the reference switches 406. Each of the sampling capacitors 410 includes bottom plate 4106 and a top plate 410T. The bottom plate 410B of each sampling capacitors 410 is coupled to one of the plurality of the sampling switches 412 and one of the plurality of the reference switches 414. Each of the sampling switches 412 includes a terminal 412B that is coupled to the bottom plate 410B of one of the sampling capacitors 410, and a terminal 412A that is coupled to an input terminal 424 (and the input 228 of the CDAC 200) for receiving the analog input signal 114. The control circuitry 112 controls the operation of the sampling switches 412 and the reference switches 414 to connect the sampling capacitors 410 to the analog input signal 114 or to a reference voltage source. For example, for a given one of the sampling capacitors 410, the control circuitry 112 closes the sampling switch 412 (and open the reference switch 414) to connect the sampling capacitor 410 to the analog input signal 114 during a sampling interval, and close the reference switch 414 (and open the sampling switch 412) to connect the sampling capacitor 410 to a reference voltage during a hold interval. The analog input signal 114 is a differential signal, and the negative side of the analog input signal 114 is provided to the input terminal 424.

The hold switch 420 includes a terminal 420A and a terminal 420B. The terminal 420A is connected to the top plate 402T of each of the sampling capacitors 402 and the top plate 410T of each of the sampling capacitors 410. The terminal 420B is connected to a top plate 422T of the hold capacitor 422. The voltage on the top plate 422T of the hold capacitor 422 is bias voltage for the tail current circuit 332 and the tail current circuit 334. Accordingly, the top plate 422T of the hold capacitor 422 is connected to the gate terminal 314G of the transistor 314 and the gate terminal 320G of the transistor 320. The hold switch 420 is controlled by the control circuitry 112. For example, the control circuitry 112 closes the hold switch 420 during a hold phase to transfer charge from the sampling capacitors 402 and the sampling capacitors 410 to the hold capacitor 422.

The top plate common mode switch 418 switchably connects the top plate 402T of the sampling capacitors 402 and the top plate 410T of the sampling capacitors 410 to the reference voltage TPCM, and to a top plate 202T and 208T of each sampling capacitor 202 and 208 of the CDAC 108. The top plate common mode switch 418 includes a terminal 418A that is connected to the terminal 420A of the hold switch 420, to the top plate 402T of each of sampling capacitors 402, and to the top plate 410T of each of the sampling capacitors 410. The control circuitry 112 closes the top plate common mode switch 418 while the sampling capacitors 402 and the sampling capacitors 410 are sampling the analog input signal 114. The switched capacitor circuit 400 also includes parasitic capacitance 408 and parasitic capacitance 416.

The sampling capacitors 402, parasitic capacitor 408, sampling capacitors 410, and parasitic capacitor 416 are replicas of the sampling capacitors 202, parasitic capacitor 218, sampling capacitors 208, and parasitic capacitor 220 respectively. Accordingly, switching of the sampling switches 404, reference switches 406, sampling switches 412, reference switches 414, and top plate common mode switch 418 in conjunction with switching of the sampling switches 204, reference switches 206, sampling switches 210, reference switches 212, and top plate common mode switch 214 generates a voltage on the top plate 422T of the hold capacitor 422 that tracks the common mode voltage present on the top plates of the sampling capacitors 202 and the 208. That is, the voltage $VTP_{HOLD}$ on the top plate 422T of the hold capacitor 422 is:

$$\frac{VTTP + VTPM}{2} = TPCM + K(REFCM - INCM)$$

Because the voltage on the top plate 422T of the hold capacitor 422, which is used to bias the tail current circuit 332 and the tail current circuit 334, accounts for the common mode voltage at the input of the CDAC 108, the preamplifier stage 300 is insensitive to the input common mode voltage and the accuracy of the 100 is improved.

Figure 5:
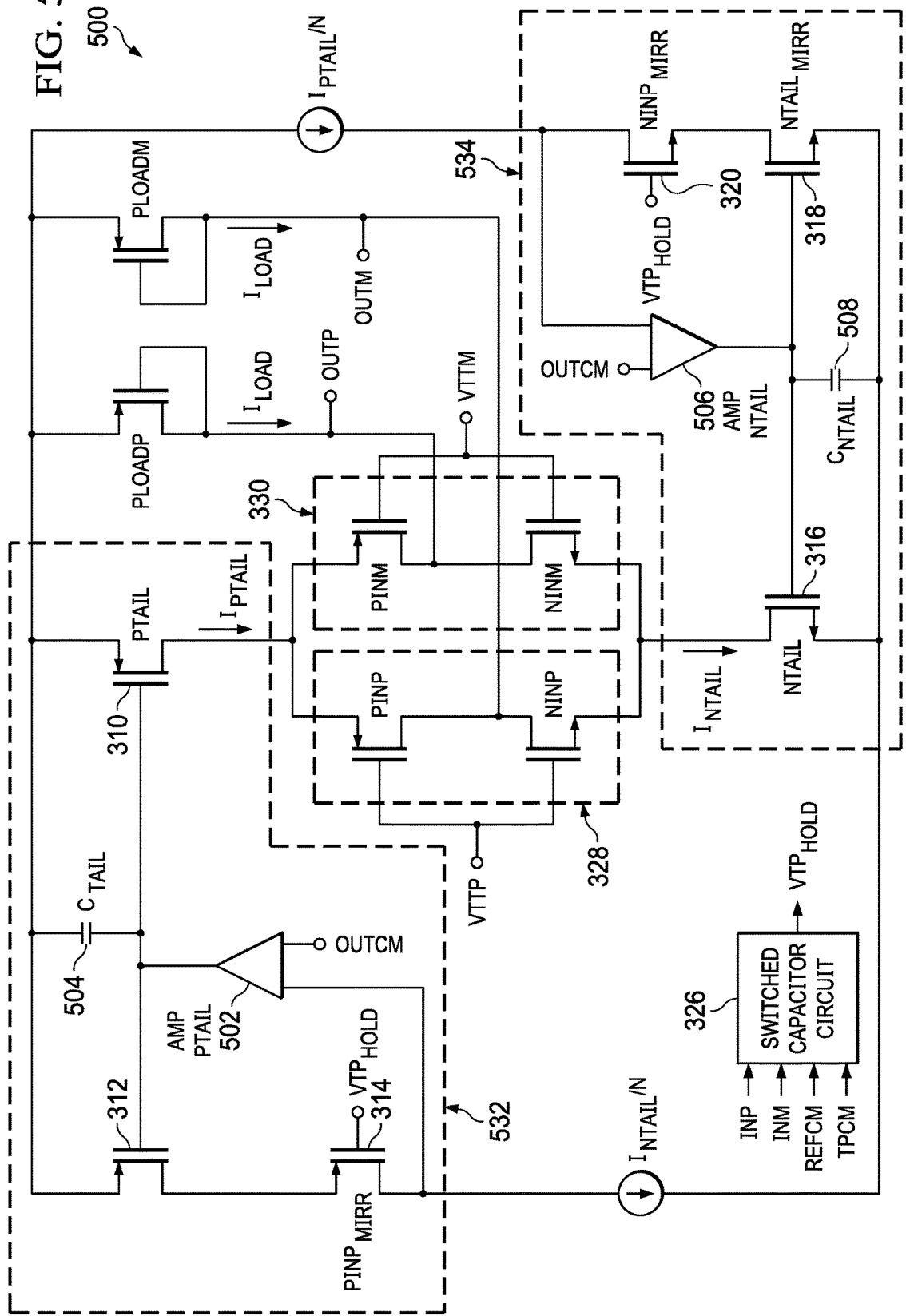
FIG. 5 shows a schematic diagram for another implementation of the preamplifier stage of a residue amplifier in accordance with the present disclosure.

FIG. 5 shows a schematic diagram for another implementation of the preamplifier stage 500 of a residue amplifier in accordance with the present disclosure. Implementations of the residue amplifiers disclosed herein include any of a variety of different bias circuits. The preamplifier stage 500 is similar to the preamplifier stage 300, but includes different tail current circuits. The preamplifier stage 500 includes the switched capacitor circuit 326, the complementary transistor pair 328, the complementary transistor pair 330, a tail current circuit 532, and a tail current circuit 534. In some implementations, the switched capacitor circuit 326 is separate from the preamplifier stage preamplifier stage 500.

The tail current circuit 532 includes the transistor 310, the transistor 312, the transistor 314, and an amplifier 502. A first input of the amplifier 502 is connected to the drain terminal of the transistor 314, and a second input of the amplifier 502 is connected to an output common mode voltage source. An output of the amplifier 502 drives the gates of the transistor 310 and the transistor 312. Some implementations of the tail current circuit 532 also include a capacitor 504 connected to the gates of the transistor 310 and the transistor 312 to filter noise.

The tail current circuit 534 includes the transistor 316, the transistor 318, the transistor 320, and an amplifier 506. A first input of the amplifier 506 is connected to the drain terminal of the transistor 320, and a second input of the amplifier 506 is connected to an output common mode voltage source. An output of the amplifier 506 drives the gates of the transistor 316 and the transistor 318. Some implementations of the tail current circuit 534 also include a capacitor 508 connected to the gates of the transistor 316 and the transistor 318 to filter noise.

Figure 6:
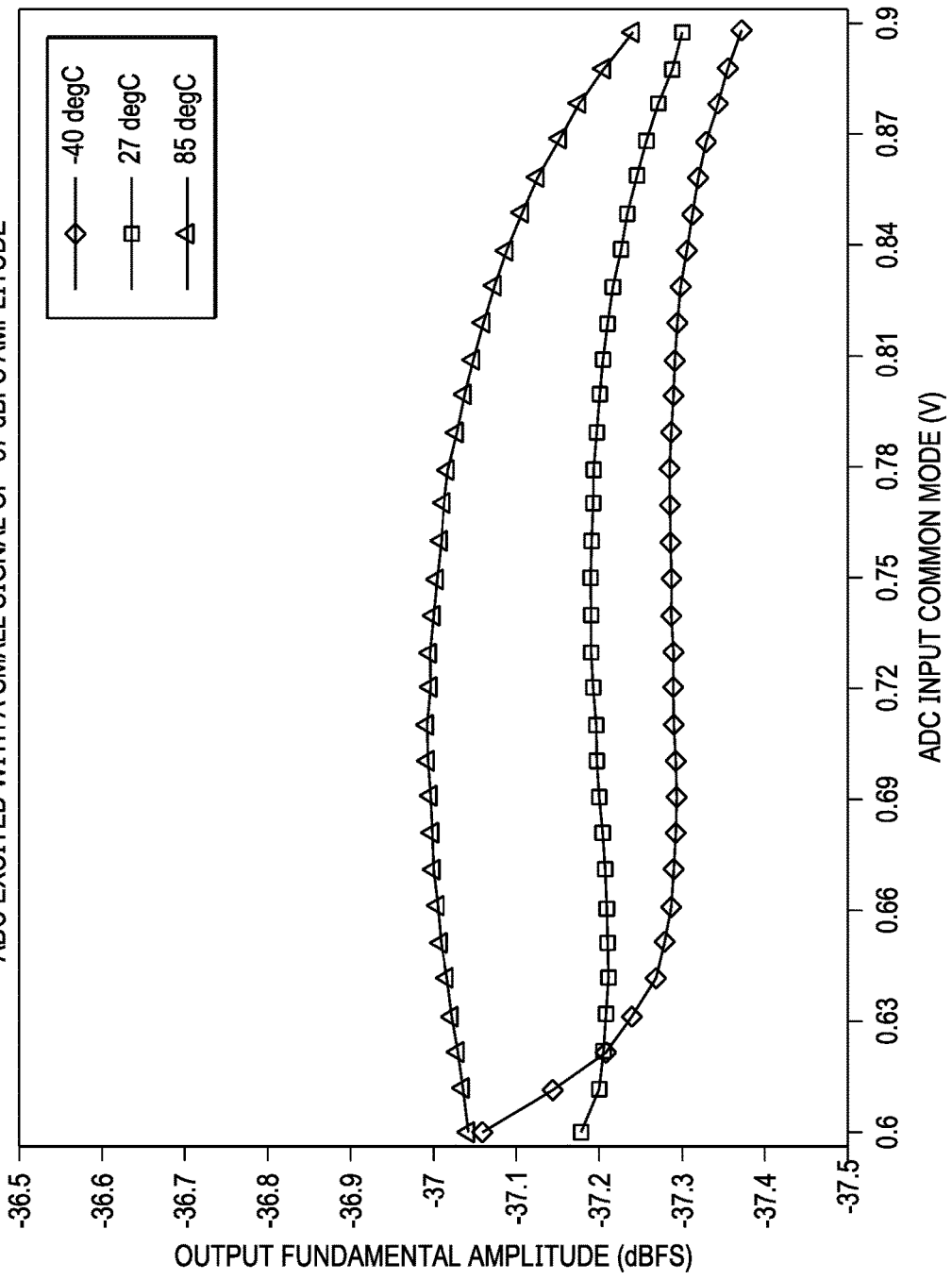
FIG. 6 shows gain variation in a residue amplifier that lacks the bias voltage generation of the present disclosure.

FIG. 6 shows gain variation in a residue amplifier that lacks the bias voltage generation of the present disclosure.

Gains for a range of input common mode voltages at various temperatures are shown. FIG. 6 shows that without the bias voltage generation disclosed herein, the gain of the residue amplifier varies with input common mode voltage and is sensitive to temperature.

Figure 7:
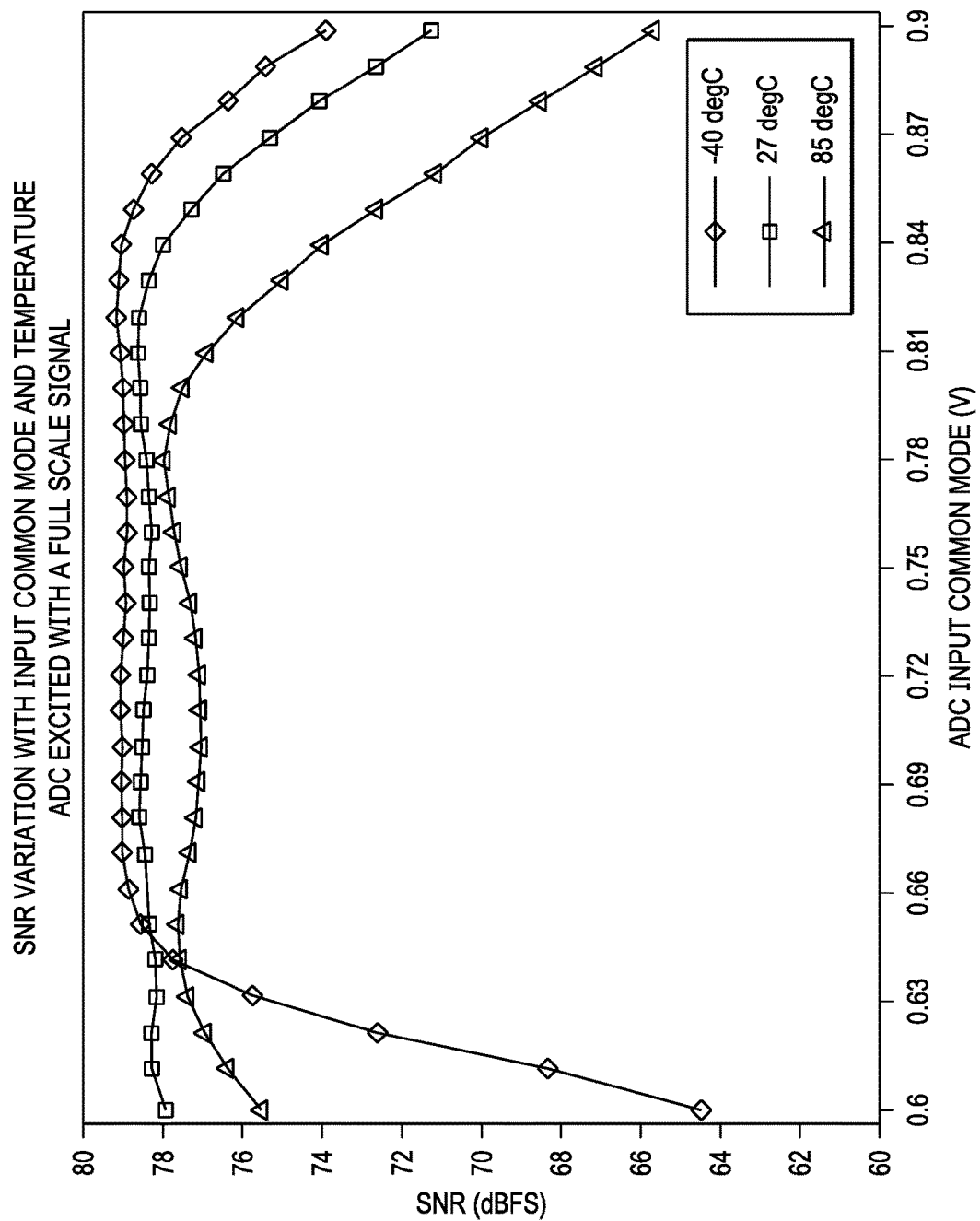
FIG. 7 shows signal-to-noise ratio variation in an ADC that includes a residue amplifier that lacks the bias voltage generation of the present disclosure.

FIG. 7 shows signal-to-noise ratio variation in an ADC that includes a residue amplifier that lacks the bias voltage generation of the present disclosure. Signal-to-noise ratio for a range of input common mode voltages at various temperatures are shown. FIG. 7 shows that without the bias voltage generation disclosed herein, the signal-to-noise ratio of the residue amplifier drops off outside of a common mode input voltage range of about 150 millivolts and is sensitive to temperature.

Figure 8:
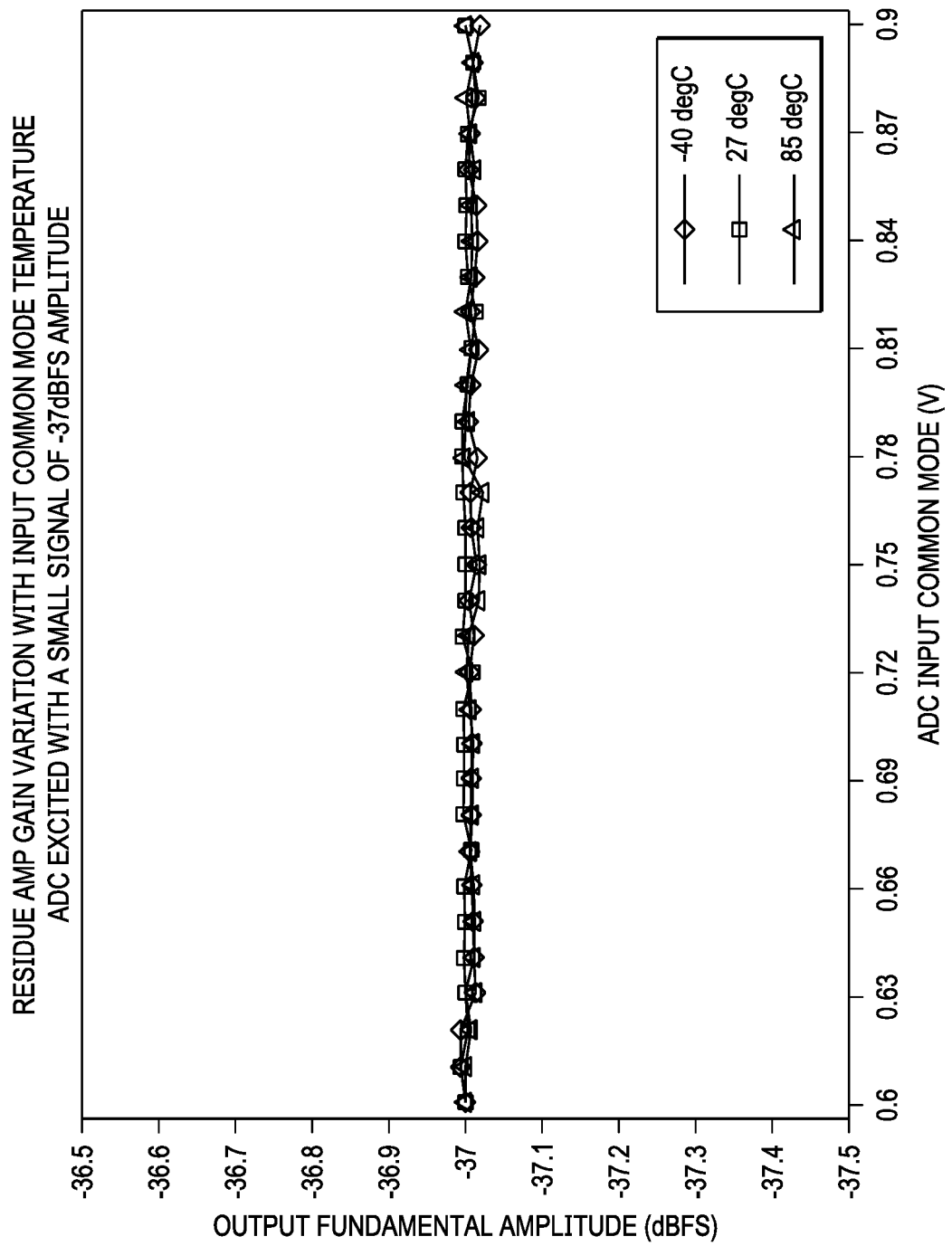
FIG. 8 shows gain variation in a residue amplifier that includes bias voltage generation in accordance with the present disclosure.

FIG. 8 shows gain variation in a residue amplifier 110 that includes an implementation of the preamplifier stage 300 disclosed herein. Gains for a range of input common mode voltages at various temperatures are shown. FIG. 8 shows that the gain of the residue amplifier 110 is generally constant over a wide range of input common mode voltage and is not sensitive to temperature.

Figure 9:
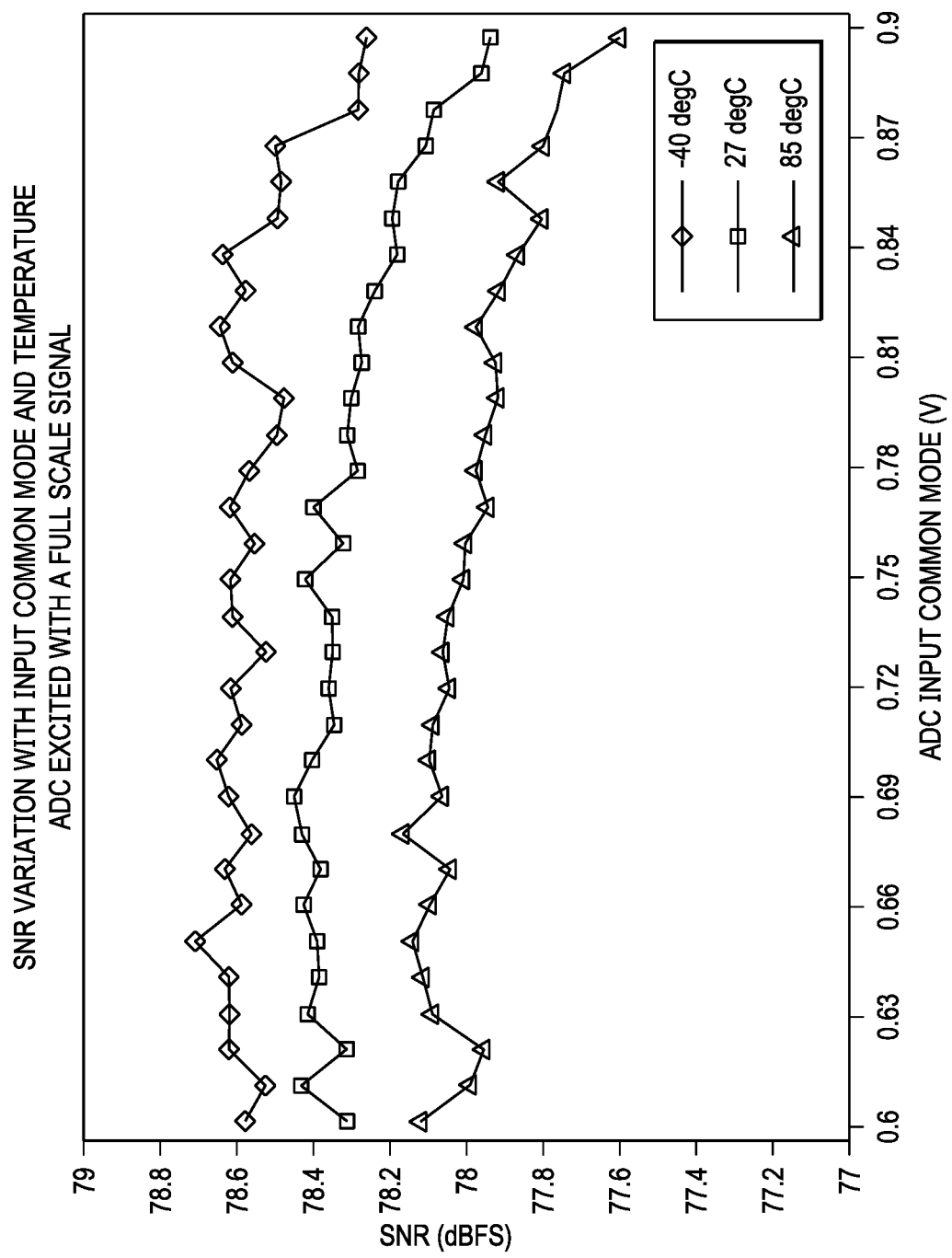
FIG. 9 shows signal-to-noise ratio variation in an ADC that includes a residue amplifier with bias voltage generation in accordance with the present disclosure.

FIG. 9 shows signal-to-noise ratio variation in a pipelined ADC 100 that includes an implementation of the preamplifier stage 300 disclosed herein. Signal-to-noise ratio for a range of input common mode voltages at various temperatures are shown. FIG. 9 shows that the signal-to-noise ratio of the residue amplifier 110 is generally stable over a wide range of input common mode voltage and is not sensitive to temperature.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. An analog-to-digital converter (ADC), comprising:
   a capacitive digital-to-analog converter (CDAC);
   a residue amplifier coupled to the CDAC, and comprising:
      a first complementary transistor pair coupled to a first output of the CDAC, and comprising:
         a high-side transistor; and
         a low-side transistor; and
      a first tail current circuit coupled to the high side transistor;
   a switched capacitor circuit coupled to inputs of the CDAC and the first tail current circuit, and configured to:
      generate a voltage to bias the first tail current circuit; and
      compensate for common mode voltage at the inputs of the CDAC.

2. The ADC of claim 1, wherein the residue amplifier further comprises a second tail current circuit coupled to the low side transistor and the switched capacitor circuit, and biased by the voltage generated by the switched capacitor circuit.

3. The ADC of claim 2, wherein the residue amplifier further comprises a second complementary transistor pair coupled to a second output of the CDAC, and comprising:
   a high-side transistor biased by the first tail current circuit; and
   a low-side transistor biased by the second tail current circuit.

4. The ADC of claim 1, wherein the switched capacitor circuit comprises:
   a first plurality of sampling capacitors, and
   a first plurality of sampling switches;
   wherein each of the sampling capacitors is coupled to a first input of the CDAC via a different one of the sampling switches.

5. The ADC of claim 4, wherein the switched capacitor circuit comprises:
   a hold switch coupled to the sampling capacitors; and
   a hold capacitor coupled to the hold switch, wherein the voltage is generated on a top plate of the hold capacitor.

6. The ADC of claim 5, wherein the switched capacitor circuit comprises:
   a second plurality of sampling capacitors, and
   a second plurality of sampling switches;
   wherein each of the sampling capacitors of the second plurality of sampling capacitors is coupled to a second input of the CDAC via a different one of the sampling switches of the second plurality of sampling switches.

7. The ADC of claim 6, wherein the switched capacitor circuit comprises a top plate common mode switch configured to switchably couple a top plate of each of the sampling capacitors of the switched capacitor circuit to a top plate of each of the sampling capacitors of the CDAC.

8. A residue amplifier, comprising:
   a preamplifier, comprising:
      a first transistor;
      a second transistor comprising:
         a first terminal coupled to a first terminal of the first transistor; and
         a second terminal coupled to a second terminal of the first transistor;
      a third transistor comprising a first terminal coupled to a third terminal of the first transistor;
      a fourth transistor comprising:
         a first terminal coupled to a second terminal of the third transistor;
         a second terminal coupled to a third terminal of the third transistor; and
         a third terminal coupled to a third terminal of the second transistor;
      a first tail current circuit coupled to the first terminal of the third transistor and the third terminal of the first transistor; and
   a switched capacitor circuit comprising a hold capacitor, wherein a top plate of the hold capacitor is coupled to a terminal of the first tail current circuit.

9. The residue amplifier of claim 8, wherein the preamplifier comprises a second tail current circuit coupled to the third terminal of the second transistor and the third terminal of the fourth transistor; wherein the top plate of the hold capacitor is coupled to a terminal of the second tail current circuit.

10. The residue amplifier of claim 9, wherein the second bias circuit comprises:
    a fifth transistor comprising a first terminal coupled to the third terminal of the second transistor and the third terminal of the fourth transistor;
    a sixth transistor comprising:
       a first terminal coupled to a second terminal of the first fifth transistor; and
       a second terminal coupled to a third terminal of the fifth transistor; and
    a seventh transistor comprising:
       a first terminal coupled to a third terminal of the sixth transistor;

a second terminal coupled to the second terminal of the sixth transistor and the third terminal of the fifth transistor; and a third terminal coupled to the top plate of the hold capacitor.

11. The residue amplifier of claim 8, wherein the first bias circuit comprises:

a fifth transistor comprising a first terminal coupled to the first terminal of the third transistor and the third terminal of the first transistor;

a sixth transistor comprising:

a first terminal coupled to a second terminal of the fifth transistor; and a second terminal coupled to a third terminal of the fifth transistor; and a seventh transistor comprising:

a first terminal coupled to a third terminal of the sixth transistor;

a second terminal coupled to the second terminal of the sixth transistor and the third terminal of the fifth transistor; and a third terminal coupled to the top plate of the hold capacitor.

12. The residue amplifier of claim 8, wherein the switched capacitor circuit comprises:

a first input terminal;

a first plurality of sampling switches, each of the sampling switches comprising a first terminal coupled to the first input terminal; and a first plurality of sampling capacitors, each of the sampling capacitors comprising a bottom plate coupled to a second terminal of one of the sampling switches.

13. The residue amplifier of claim 12, wherein the switched capacitor circuit comprises:

a second input terminal;

a second plurality of sampling switches, each of the sampling switches of the second plurality of sampling switches comprising a first terminal coupled to the second input terminal; and a second plurality of sampling capacitors, each of the sampling capacitors of the second plurality of sampling capacitors comprising a bottom plate coupled to a second terminal of one of the sampling switches of the second plurality of sampling switches.

14. The residue amplifier of claim 13, wherein the switched capacitor circuit comprises a hold switch comprising:

a first terminal coupled to a top plate of the each of the sampling capacitors of the first plurality of sampling capacitors and to a top plate of the each of the sampling capacitors of the second plurality of sampling capacitors; and a second terminal coupled to the top plate of the hold capacitor.

15. The residue amplifier of claim 13, wherein the switched capacitor circuit comprises a top plate common mode switch comprising a first terminal coupled to the first terminal of the hold switch.

16. A residue amplifier, comprising:

a preamplifier comprising:

a first input terminal for connection to a first output of a capacitive digital-to-analog converter (CDAC);

a second input terminal for connection to a second output of the CDAC;

a first complementary transistor pair coupled to the first input terminal;

a second complementary transistor pair coupled to the second input terminal;

a first tail current circuit coupled to, and configured to provide a first bias current to, the first complementary transistor pair and the second complementary transistor pair;

a second tail current circuit coupled to, and configured to provide a second bias current to, the first complementary transistor pair and the second complementary transistor pair; and a switched capacitor circuit coupled to the first tail current circuit and the second tail current circuit, and configured to provide to the first tail current circuit and the second tail current circuit a bias voltage that is a function of top plate common mode voltage provided to the CDAC and common mode voltage of input signal provided to the CDAC for digitization.

17. The residue amplifier of claim 16, wherein the switched capacitor circuit comprises:

a first plurality of sampling capacitors, a first plurality of sampling switches; wherein each of the sampling capacitors is coupled to a first input of the CDAC via a different one of the sampling switches;

a second plurality of sampling capacitors, and a second plurality of sampling switches;

wherein each of the sampling capacitors of the second plurality of sampling capacitors is coupled to a second input of the CDAC via a different one of the sampling switches of the second plurality of sampling switches.

18. The residue amplifier of claim 17, wherein the switched capacitor circuit comprises a top plate common mode switch configured to switchably couple a top plate of each of the sampling capacitors of the switched capacitor circuit to a top plate of each sampling capacitor of the CDAC.

19. The residue amplifier of claim 18, wherein the switched capacitor circuit comprises:

a hold switch coupled to the sampling capacitors; and a hold capacitor coupled to the hold switch.

20. The residue amplifier of claim 19, wherein the bias voltage is generated on a top plate of the hold capacitor.

* * * * *